(12) United States Patent
Maeda et al.

(10) Patent No.: US 7,825,422 B2
(45) Date of Patent: Nov. 2, 2010

(54) CERAMIC SUBSTRATE FOR MOUNTING A LIGHT EMITTING ELEMENT AND METHOD FOR MANUFACTURING THE SAME

(75) Inventors: Masakatsu Maeda, Yamaguchi (JP); Yasuyuki Yamamoto, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 704 days.

(21) Appl. No.: 11/660,476

(22) PCT Filed: Aug. 16, 2005

(86) PCT No.: PCT/JP2005/014939

§ 371 (c)(1),
(2), (4) Date: Feb. 16, 2007

(87) PCT Pub. No.: WO2006/019090

PCT Pub. Date: Feb. 23, 2006

(65) Prior Publication Data

US 2007/0252523 A1    Nov. 1, 2007

(30) Foreign Application Priority Data

Aug. 18, 2004 (JP) .............................. 2004-237886

(51) Int. Cl.
*H01L 33/58* (2010.01)
(52) U.S. Cl. ...................... 257/98; 257/629; 257/701; 257/E33.072; 438/770

(58) Field of Classification Search ................ 257/629, 257/701, E33.072, 98; 438/770
See application file for complete search history.

(56) References Cited

U.S. PATENT DOCUMENTS 5,525,560 A * 6/1996 Yamazaki et al. ........... 501/103

FOREIGN PATENT DOCUMENTS

| JP | 2-44084 | 2/1990 |
|---|---|---|
| JP | 6-116039 | 4/1994 |
| JP | 8-119742 | 5/1996 |
| JP | 2000-286457 | 10/2000 |
| JP | 2003-060243 | 2/2003 |

(Continued)

*Primary Examiner*—Jerome Jackson, Jr.
*Assistant Examiner*—Dale Page
(74) *Attorney, Agent, or Firm*—Ladas & Parry LLP

(57) ABSTRACT

A ceramic substrate for mounting a light emitting element. The ceramic substrate has a placement surface for placing a light emitting element having an electrode; and an electrode electrically-connected with the electrode of the light emitting element, wherein the ceramic substrate comprises a substrate body consisting of a nitride ceramics; and a coat layer coating at least a part of a surface of the substrate body and consisting of a ceramics different from the nitride ceramics forming the substrate body; and the coat layer has an optical reflectance of 50% or more for any light having a wavelength of from 300 to 800 nm, which can increase a luminance of the light emitting element by reflecting the light emitted from the element efficiently with certainty, and which has a high heat radiation property; and a manufacturing method therefor.

6 Claims, 3 Drawing Sheets

FOREIGN PATENT DOCUMENTS

| | | |
|---|---|---|
| JP | 2003-273405 | 9/2003 |
| JP | 2004-140185 | 5/2004 |
| JP | 2004-152840 | 5/2004 |
| JP | 2004-152952 | 5/2004 |
| JP | 2004-152952 A * | 5/2004 |
| JP | 2004-172577 | 6/2004 |
| JP | 2004-179342 | 6/2004 |
| JP | 2004-207678 | 7/2004 |
| WO | WO 95/21139 | 8/1995 |
| WO | 2004/005216 | 1/2004 |

* cited by examiner

CERAMIC SUBSTRATE FOR MOUNTING A LIGHT EMITTING ELEMENT AND METHOD FOR MANUFACTURING THE SAME

FIELD OF THE INVENTION

The invention relates to a ceramic substrate used for mounting a light emitting element such as a light emitting diode or the like and a manufacturing method therefor.

BACKGROUND ART

A light emitting element has been applied in various fields because of low electrical power consumption. For example, a light emitting diode (hereinafter can be referred to as LED for short) can work not only as a monochromatic LED emitting light in red, green, blue or the like, but also as a white LED by providing a fluorescent material on a blue LED; therefore, LEDs, with the help of improvement on luminance thereof, have been widely spread in application over many fields such as a light source for an electric display board, a backlight source for a portable telephone, a personal computer and the like.

An LED emitting blue light has been generally manufactured by forming an electrode for p type and an electrode for n type onto the surface of the GN-based compound semiconductor which is laminated on a insulating substrate consisting of sapphire. Such an LED emitting blue light has been in more cases employed as a so-called flip-chip type light emitting element, which is surface mounted at the electrodes. In such a flip-chip type light emitting element, the surface of the sapphire substrate can be a light emitting surface by mounting the element so as to the substrate facing to a light emitting direction because sapphire has translucency. Recently, a light emitting element chip has been mounted on a substrate of equipment, and in addition, as a useful light emission source, a complex light emitting element has been employed. In the complex light emitting element, the light emitting element chip is mounted, for example, on a submount element for electrostatic protection with a Zener diode.

Such a complex light emitting element has a structure that a flip chip type blue light emitting element is conduction-mounted on a submount, which is conduction-mounted on amounting substrate incorporated in electronic equipment or the like. Conventionally, a silicon substrate has been used as a submount, whereas there has been a problem that a complex light emitting element is reduced in luminance thereof since the silicon substrate absorbs light in the wavelength range of from 450 nm (blue) to 560 nm (green) emitted from an LED.

Therefore, a proposal has been made on a complex light emitting element having a mounting surface for a light emitting element, which surface is made from a white insulator such as alumina, without such a problem (see Japanese Patent Application Laid-Open No. 2003-60243).

An aluminum oxide sintered body in white color of which an insulating substrate of Japanese Patent Application Laid-Open No. 2003-60243 is constituted has a property that a reflectance is 50% or more in the range of from 350 to 560 nm in wavelength, while, on the other hand, having a property of a thermal conductivity of about 20 W/m·K, which is relatively small, which makes it hard to radiate heat from the light emitting element to outside, causing a possibility of damage in the light emitting element to be revealed.

DISCLOSURE OF THE INVENTION

Problem to be Solved by the Invention

It is thought that such a problem can be solved by using a nitride ceramics high in thermal conductivity and a submount which is constituted of an insulating material high in light reflectance, whereas there has been known no insulating material satisfying such requirements. For example, an aluminum nitride sintered body has been conventionally known as an insulating material high in thermal conductivity, whereas having had a problem of a tone of light transmissive gray color and low in light reflectance.

It is accordingly an object of the invention to provide a ceramic substrate for mounting a light emitting element high both in light reflectance on a surface thereof and thermal conductivity thereof in order to obtain a complex light emitting element without the problem.

Means to Solve Problem

The present inventors have been conducted serious studies in order to solve the problem. As the result, the present inventors have acquired an idea that a ceramic layer high in reflectance is formed on a surface of a nitride ceramic substrate high in thermal conductivity such as an aluminum nitride sintered body, and have succeeded in finding out a method in which the ceramic layer high in light reflectance well bonded to the surface of a nitride ceramic substrate is formed on the surface thereof, having led to completion of the invention.

The present invention will be explained. Note that reference numerals used in accompanying drawings are attached to the corresponding constituents stated in the specification in parentheses directly after the respective names thereof for facilitating understanding of the invention, to which it should be understood the invention is not limited to the ways shown in the figures.

That is, a first invention is directed to a ceramic substrate (100) for mounting a light emitting element comprising a ceramic substrate (110) having a placement surface for placing a light emitting element (200) having an electrode (210) and an electrode (113) electrically-connected with the electrode (210) of the light emitting element (200), wherein the ceramic substrate (110) comprises a substrate body (111) consisting of a nitride ceramics and a coat layer (112) which is coating at least a part of a surface of the substrate body (111) consisting of a ceramics different from the nitride ceramics forming the substrate body (111), and the coat layer (112) has an optical reflectance of 50% or more for any light having a wavelength of from 300 to 800 nm.

In the ceramic substrate (100) for mounting a light emitting element of the invention, since the substrate body (111) is made from a nitride ceramics, heat radiation is efficiently proceeded through the substrate and damage due to heat of the light emitting element can be perfectly suppressed. Since a surface layer portion of an exposed surface of the element placement surface side is constituted of the coat layer (112) consisting of ceramics having an optical reflectance of 50% or more for any light having wavelength of from 300 to 800 nm (such a ceramics is also referred simply as "white ceramics" for short because of being white when the ceramics has a thickness of, for example, 5 μm or more), a luminance of the light emitting element (200) can be increased.

The coat layer (112) having a reflectance of 70% or more of light with a wavelength of 400 nm on a surface of the coat layer (112) is used with a white LED (a white LED usually emits blue or light in the near-ultraviolet region, which is converted to various wavelengths using various kinds of fluorescent material) as a light emitting element (200), in which case high luminance can also be obtained.

The coat layer (112) of the ceramic substrate (100) for mounting a light emitting element contains following aspects (embodiments):

(First aspect) A coat layer (112) formed in a procedure in which a sintered body made from a nitride ceramics in a desired shape (a shape of the ceramic substrate (110) including the coat layer (112) and the substrate body (111)) is prepared and a portion where the coat layer (112) is formed in the sintered body is oxidized to thereby transform the nitride ceramics of the portion to oxide;

(Second aspect) A coat layer (112) provided on a surface of the substrate body (111) consisting of a nitride ceramics and which is consisting of a white ceramic different from the nitride ceramics;

(Third aspect) A combination type of the first aspect and the second aspect, that is a coat layer in a multilayer structure formed by stacking a different kind of white ceramic layer on an oxide layer formed by the same way to form the first aspect.

In the second aspect, "a white ceramics different from the nitride ceramics" used as a term here includes: even the nitride ceramics having the same composition as nitride ceramics of the substrate, which exhibits white color because of different micro-structure or another reason and therefore, high light reflectance.

Of light emitting element mounting ceramic substrates (100) of the invention, a substrate with the coat layer (112), which is of the first aspect, has a feature that a bonding strength between the substrate body (111) and the coat layer (112) is especially high. A substrate with the coat layer (112), which is of the second aspect or the third aspect, a degree of freedom for selection on ceramic material for the coat layer (112) is large, which has a feature that makes it possible to use a material higher in light reflectance.

If, even in the second aspect, a white ceramics constituting the coat layer (112) is the same composition as a ceramic material constituting the underlying substrate body (111), an additional feature can be obtained that a bonding strength between the coat layer (112) and the substrate (111) is high.

In the ceramic substrate (100) for mounting a light emitting element, a surface layer portion of an exposed surface on the placement surface side of the ceramic substrate (110) is preferably formed with the coat layer (112). With such a construction, a luminance of the light emitting element (200) can be effectively improved. A layer thickness of the coat layer (112) is preferably in the range of from 5 to 500 μm. Within the range of a thickness adopted, no influence is exerted on a thermal conductivity of all the ceramic substrate (110) and a high reflectance can be obtained.

Further, the invention provides a method for manufacturing a ceramic substrate (100) for mounting a light emitting element of the invention. That is, the invention provides a method for effectively manufacturing the ceramic substrate (100) for mounting a light emitting element having the coat layer (112) of the first aspect, including the steps of: forming a composition containing a compound having a nitride ceramics therein into a shape of a sheet; forming a conductive portion (113, 114 and 115) on the obtained sheet; firing the sheet having the conductive portion to prepare a raw substrate, and oxidizing the raw substrate in an oxygen atmosphere to obtain a ceramic substrate (110) having a coat layer (112) consisting of an oxide ceramics.

The invention provides a method for effectively manufacturing ceramic substrate (100) for mounting a light emitting element having a coat layer (112) of the second aspect, including the steps of: forming a composition containing a compound having a nitride ceramics therein into substantially the same shape as a substrate body (111); coating a composition containing a white ceramics on a surface of the formed composition; and firing the formed composition coated with a composition containing a white ceramics to obtain a ceramic substrate (110) having a coat layer (110) consisting of white ceramics.

The invention provides an another method for effectively manufacturing ceramic substrate (100) for mounting a light emitting element having a coat layer of the second aspect, including the steps of: forming a composition containing a compound having a nitride ceramics therein into substantially the same shape as a substrate body (111); firing the formed composition to obtain a sintered substrate body; coating a nitride ceramic paste on a surface of the sintered substrate body; and firing the sintered substrate body coated with the nitride ceramic paste in an atmosphere containing a reducing gas, wherein the firing in the atmosphere containing a reducing gas is conducted in conditions in which voids of 0.1 μm or more in diameter remain in the sintered body obtained by sintering the nitride ceramic paste.

The present invention provides a complex light emitting element (300) comprising the ceramic substrate (100) for mounting a light emitting element (200) and a light emitting element (200) bonded onto the substrate. A complex light emitting element of the invention is a high performance complex light emitting element equipped with a light emitting element mounting ceramic substrate excellent in the performance.

Effect of the Invention

A ceramic substrate for mounting a light emitting element of the invention can not only suppress damage due to heat of a light emitting element with certainty because of excellency in heat radiation property, but also raise a luminance of the light emitting element because of efficient reflection of light generated on the side face and back face of the light emitting element.

BEST MODE FOR CARRYING OUT THE INVENTION

The present invention will be explained below with reference to the figures. FIGS. 1 to 3 are sectional views showing as a model ceramic substrates 100a to 100c for mounting a light emitting element of the invention in various ways of configuration. First, comprehensive description will be given that is common to all the figures.

A ceramic substrate 100 for mounting a light emitting element of the invention is ceramic made substrate on which a light emitting element 200 such as LED or laser is to be mounted and preferably used as a submount. A ceramic substrate 100 for mounting a light emitting element of the invention is constituted of a ceramic substrate 110 having a placement surface for placing the light emitting element 200 having electrodes and electrodes 113 connected electrically to the electrodes of the light emitting element in a similar way to that in a conventional ceramic substrate for mounting a light emitting element (for example, a conventional ceramic submount for mounting a light emitting element). A ceramic substrate 100 for mounting a light emitting element of the invention is not specifically different from a conventional substrate with respect to a shape and size of the substrate, a shape and size each of electrodes and placement of the electrodes, and in addition a shape, a size and placement of a wiring pattern accompanying them, which are determined properly depending on an application.

The ceramic substrate 110 of a ceramic substrate 100 for mounting a light emitting element of the invention includes: a substrate body 111 consisting of a nitride ceramics; and a coat layer 112, coating at least a part of a surface of the substrate body, and consisting of a ceramics different from the nitride ceramics forming the substrate body. In the ceramic substrate 100, the coat layer 112 has an optical reflectance of 50% or more for any light having a wavelength of from 300 to 800 nm. Thereby, not only can damage due to heat of the light emitting element 200 suppressed with more of certainty when the light emitting element 200 is actually mounted and used, but a luminance of the light emitting element 200 can also be increased. Note that a reflectance of a ceramic can be measured by a spectrophotometer provided with an integrating sphere.

The substrate body 111 is made from a nitride ceramics in order to radiate heat efficiently therethrough. A known nitride ceramics such as aluminum nitride and silicon nitride can be used as a nitride ceramics from which the substrate 111 is made, of which aluminum nitride is preferably used from the viewpoint of thermal conductivity, and an aluminum nitride sintered body obtained by sintering aluminum nitride powder with a sintering aid added thereto is especially preferable from the viewpoint of forming at low cost with ease. No specific limitation is placed on a sintering aid and any of those commonly used can be used. Examples of sintering aids that can be preferably used include: oxides of rare earth metals such as yttrium oxide; erbium oxide; salts and double oxides of alkalline earth metals such as calcium oxide, calcium fluoride, calcium nitrate, calcium carbonate, calcium phosphate, and $3CaO.Al_2O_3$. In a ceramic substrate 100 for mounting a light emitting element of the invention, a thermal conductivity of the substrate body 111 is preferably 170 W/m·K or more and more preferably 200 W/m·K or more. Note that a thermal conductivity can be measured by a laser flash method with ease.

The coat layer 112 has a function to reflect light emitted from the side face and back face of the light emitting element 200 to improve a luminance. A white ceramics of which the coat layer 112 is constituted is different from the ceramics from which the substrate body 111 is made and can be a known ceramic material having a reflectance of 50% or more and more preferably 60% or more for a light having a wavelength of from 300 to 800 nm when a coat layer has a thickness of at least 5 μm. Among them, in order to increase a luminance when a white LED is used, it is prefer to use a white ceramics having a reflectance of preferably 70% or more and especially preferably 80% or more for the light with a wavelength of 400 nm.

Note that the term "a different ceramics" includes a white ceramics of which composition is the same as the composition of the nitride ceramics constituting of the substrate body 111, but a micro structure of which is different from the nitride ceramics, resulting in a high light reflectance and light in white color to be emitted.

Examples of a white ceramics that can be preferably used include: boron nitride, aluminum oxide, (white) aluminum nitride, (white) silicon nitride, magnesium oxide, titanium oxide and the like. Among them, aluminum oxide ceramics or boron nitride ceramics is especially preferably used because of high reflectance and boron nitride is most preferably used. The coat layer 112 is preferably constituted of a white nitride ceramics containing the same kind of nitride as the substrate body 111 from the viewpoint of high light reflectance and high bondability with the substrate body 111. For example, when the substrate body 111 is constituted of an aluminum nitride sintered body, the coat layer 112 is preferably constituted of a white aluminum nitride ceramics, while when the substrate body 111 is constituted of a silicon nitride sintered body, the coat layer 112 is preferably constituted of white a silicon nitride ceramics.

No specific limitation is placed on the coat layer 112 in any way as far as the coat layer 112 covers at least a part of the surface of the substrate body 111 and it is preferable that a surface layer portion of an exposed surface on the placement surface side for placing the light emitting element 200 on the substrate body 110 is constituted of the coat layer 112. A thickness of the coat layer 112 is preferably in the range of from 5 to 500 μm and especially preferably in the range of from 10 to 300 μm from the viewpoint of achievement of a high reflectance without exerting an adverse influence on a thermal conductivity of the entire substrate 110 though depending on a kind of ceramics of which the coat layer is constituted and a thickness of the whole of the substrate. When the ceramics of which the coat layer is constituted is the ceramics low in thermal conductivity such as aluminum oxide, the lower limit of the thickness of the coat layer is preferably 5 μm and especially preferably 10 μm, while the upper limit is preferably 10% and especially preferably is 5% of the whole thickness of the substrate. If the thickness of the coat layer 112 is less than 5 μm, a reflectance for light having a wavelength of from 300 to 800 nm is less than 50% in some case under an influence of underlying substrate according to a kind of white ceramics thereof. An arithmetic mean roughness (Ra) of the coat layer 112 is preferably 3 μm or less and especially preferably 0.8 μm or less from the viewpoint of efficient light reflection.

A ceramic substrates 100a to 100c for mounting a light emitting element, these are aspects or embodiments of the invention, will be individually explained with reference to the figures.

FIG. 1 is a sectional view showing a frame format of a ceramic substrate 100a for mounting a light emitting element of the invention. The ceramic substrate 100a is used for mounting a light emitting element 200 having electrodes 210a and 210b and include conductive portions 113, 114 and 115 and the ceramic substrate 110 in the shape of a near-quadrangular flat plate. The electrodes 210a and 210b of the light emitting element 200 and light emitting element connecting electrodes 113 and 113' connected electrically to the respective electrodes 210a and 210b of the light emitting element 200 are formed on a placement surface for placing the light emitting element 200 on the surface of the ceramic substrate 110.

Power supply electrodes 115 and 115' for connecting electrically to a circuit substrate not shown and the like are coated on the rear face of the ceramic substrate 110. The light emitting element connecting electrodes 113 and 113' are connected electrically to power supply electrodes 115 and 115' through vial holes 114 and 114' filled with conductive material. Thereby, conductive portions are formed that extends from the power supply electrodes 115 and 115' to the light emitting element connecting electrodes 113 and 113' through the via holes 114 and 114'.

Then, the light emitting element 200 such as LED is connected electrically (mounted) to the light emitting element connecting electrodes 113 and 113' through electrodes 210a to 210b, for example, by ultrasonic welding. After the light emitting element 200 is mounted in such a way, the light emitting element 200 can be airtight-sealed with a transparent resin such as epoxy resin or silicone resin (the process conducted here applies in a similar way to the substrates shown in FIGS. 2 and 3 described later). When such sealing has been conducted, it is preferable since separation or falling off of the coat layer can be effectively prevented when in use or handling.

The ceramic substrate 110 is constructed of: the substrate body 111 consisting of a nitride ceramics; and the coat layer 112a constituted of a white ceramics different from the nitride ceramics from which the substrate body 111 is made, and covering part of the surface of the substrate body 111. The ceramic substrate 100a for mounting a light emitting element shows a construction in which the coat layer 112a is constituted of oxide obtained by oxidizing the nitride ceramics from which the substrate body 111 is made (for example, when the nitride ceramics is aluminum nitride, the oxide is aluminum oxide, while when the nitride ceramics is silicon nitride, the oxide is silicon oxide).

In the ceramic substrate 100a for mounting a light emitting element, since the surface layer portion of an exposed surface (a surface portion that is not covered by the light emitting element connecting electrodes 113 and 113') of the side on which the light emitting element 200 is placed is all covered with the coat layer 112a, light emitted from the lower surface and side surface of the light emitting element 200 is effectively reflected to increase a luminance of the light emitting element 200. Note that when the coat layer 112a is constituted of oxide obtained by oxidizing the nitride ceramics from which the substrate body 111 is made, a feature is available that bondability between the substrate body 111 and the coat layer 112a is very high.

The ceramic substrate 100a for mounting a light emitting element shown in FIG. 1 can be effectively manufactured according to the following method. That is, the method includes: (1) a step of preparing a sintered body made from a nitride ceramics having conductive portions (constituted of the light emitting element connecting electrodes 113 and 113'; the via holes 114 and 114'; and the power supply electrodes 115 and 115') (the sintered body is hereinafter also referred to as a raw substrate for short); and (2) a step of heat treating (oxidizing) the raw substrate in oxygen gas or an atmosphere containing oxygen to transform a ceramics of the surface layer portion of an exposed surface of the raw substrate to oxide, with which the ceramic substrate 100a for mounting a light emitting element can be preferably manufactured. The method when an aluminum nitride sintered body is used, as a nitride ceramic will be explained as an example.

First, in order to manufacture a raw substrate, organic solvents such as alcohols and toluene, a proper organic binder, a plasticizer such as a glycerine compound, a dispersant and the like are, according to a common method, added and mixed into aluminum nitride raw material powder in which a sintering aid as described above may be contained to obtain a slurry and then the slurry is formed into the shape of a sheet with a properly selected necessary thickness by a sheet forming technique such as a doctor blade method or the like (the sheet is also hereinafter referred to as green sheet for short). In this process, organic binders that can be used are known binders generally employed when a green sheet is prepared, such as polyvinyl butyral, ethyl celluloses and acrylic resins. Among them, preferably used are poly n-butyl methacrylate, polyvinyl butyral and the like because of good moldability of a green sheet.

Then, the conductive portion is formed, wherein when the conductive portion is formed with a co-firing method, through-holes for the via holes 114 and 114' extending from the upper surface to the lower surface of the green sheet are firstly punched through using a punching metal die and then, the formed through holes are filled with, for example, a metal paste including a metal power such as tungsten or molybdenum by means of, for example, printing or a press-in. Thereafter, patterns for the light emitting element connecting electrodes 113 and 113' and patterns for the power supply electrodes 115 and 115' are formed by coating a metal paste similar to those described above with a screen printing or the like. The green sheet (and the metal paste) is degreased and fired to thereby sinter ceramic particles and metal particles and to prepare the raw substrate.

Degreasing is achieved by heat treating in an atmosphere of one of the following gas, in order not to oxidize a metal such as tungsten, including a reducing gas such as hydrogen, an inert gas such as argon or a nitrogen, carbon dioxide and a mixed gas thereof, and a humidified gas obtained by mixing water vapor thereinto. Further, degreasing is conducted properly selecting a temperature in the range of from 250 to 1200° C. and a time in the range of from 1 to 1000 min according to a kind and a quantity of an organic constituent contained in a green sheet.

Firing subsequent to the degreasing is conducted usually at a temperature in the range of from 1600 to 2000° C. and preferably at a temperature in the range of from 1750 to 1850° C. usually for a time in the range of from 1 to 20 hr and preferably for a time in the range of from 2 to 10 hr. The firing is conducted in an atmosphere of non-oxidizing gas such as nitrogen at an ordinary pressure. With such firing applied, a thermal conductivity of an obtained sintered body can be 170 W/m·K or more and, if a limited condition is further applied, 200 W/m·K or more.

After the firing, exposed end surfaces of a metal layer obtained by sintering the metal paste is covered with a noble metal such as gold to thereby form the conductive portion. The reason why the exposed end surfaces are covered with a noble metal is that a high melting point metal such as tungsten is prevented from being oxidized in an oxidation treatment described later and not only is the high melting point metal prevented from oxidation corrosion during usage, but solderbility (solder wettability and a bonding strength after the boding) when an element and a wire are soldered is also enhanced. Coverage with a noble metal is achieved by a plating method, or a thin film forming method such as a sputtering or a vacuum vapor deposition. For example, when a plating method is adopted, only gold plating is applied prior to the oxidation treatment described later and thereafter, the oxidation treatment is conducted, followed by sequential coating of a nickel plated layer, and a gold plated layer with an electroplating or an electroless plating. Alternatively, a case is also conceivable where the gold plating coat is removed by an etching solution including a cyanide after oxidation and thereafter, a nickel plated layer, and a gold plated layer are sequentially coated with an electroplating or an electroless plating. When a thin film forming method is adopted, only gold is vapor deposited, the gold coat is etched off after an oxidation treatment in a similar way to that in a plating method and thereafter, titanium/platinum/gold or titanium/nickel/gold are sequentially coated with a sputtering method or a vapor deposition method. A method may also adopted in which after an oxidation treatment without coating a noble metal such as gold prior to the oxidation treatment, an oxidized high melting point metal section is subjected to an etching treatment or a reduction treatment during a heat treatment in an reducing atmosphere and then a film may be formed with a plating method, a sputtering method or a vapor deposition method.

The conductive portion can also be formed by a post-firing method. When the post firing method is adopted, a method has only to be adopted in which only a green sheet is degreased and fired to obtain a raw substrate (on this occasion, the conductive portion is still not formed), after drilling is conducted in the raw substrate, filling with a metal paste is conducted and a pattern is formed in a similar way to that as described above and further the metal paste (to be exact, metal particles contained in the metal paste) is fired and sintered. A method can also be adopted in which only via holes are formed with the co-firing method or the post-firing method and the element bonding electrodes and power supply electrodes are formed using a so-called thin film metallization method such as a sputtering method or a vapor deposition method in a vacuum apparatus.

The raw substrate fabricated in this way is subjected to an oxidation treatment in an oxygen atmosphere to thereby form the coat layer 112 constituted of oxide at a surface of the raw substrate, which is an aluminum nitride sintered body. In this case, an oxidation treatment has only to be conducted in an atmosphere containing oxygen gas such as air in the range of from 10 to 100 vol % in content. Oxidation conditions for firing have only to be such that a temperature is in the range of from 800 to 1500° C. and preferably in the range of from 1200 to 1400° C.; and a time is in the range of from 1 to 100 hr and preferably in the range of from 5 to 20 hr. A thickness of the coat layer 112a can be controlled by altering an oxygen concentration in an atmosphere and a firing time when a firing temperature is at a constant value (as an oxygen concentration is higher or a firing time is longer, the coat layer 112a is thicker). Note that when an oxidation treatment is conducted, it is preferable to conduct the oxidation treatment in an oxygen atmosphere, following heat treatment of the raw substrate at 1100° C. or higher in an inert gas, because a dense oxide layer is obtained.

Note that when a post-firing method or a combination of a post-firing method with a thin film metallization method is adopted as a formation method for a conductive portion, it is naturally possible to conduct an oxidation treatment prior to formation of a metallized layer. Since a co-firing method is adopted in the ceramic substrate 100a for mounting a light emitting element shown in FIG. 1, the coat layer (an oxide layer) 112a is not formed inside the electrodes. The coat layer 112a can be formed at desired places by conducting an oxidation treatment with a mask used.

FIG. 2 is a sectional view showing a frame format of a ceramic substrate 100b for mounting a light emitting element of the invention. In the ceramic substrate 100b for mounting a light emitting element, the conductive portion is constituted of only the light emitting element bonding electrodes 113 and 113' (power from outside is supplied directly to the electrodes) and the electrode 210b of the light emitting element 200 and the light emitting element bonding electrode 113' are connected to each other with a bonding wire 300 made of a gold wire.

In the substrate 100b, the coat layer 112b is constituted of aluminum oxide (alumina) obtained by oxidation treatment of aluminum nitride from which the raw substrate. In the substrate 100b, however, since the conductive portion 113 and 113' are formed after the oxidation, the coat layer (an oxide layer) 112b is formed in the underlying layer of the light emitting element bonding electrodes 113 and 113', which is the conductive portion. The conductive portion can be formed by a thick film method or a thin film method. When the underlying layer of the metal layer is constituted of oxide in such a way, a merit can be obtained that a bonding strength becomes higher, as compared with a case where a metal layer is formed directly on nitride ceramics, according to a kind of a metal layer or a formation method for a metal layer.

FIG. 3 is a sectional view showing a frame format of a ceramic substrate 100c for mounting a light emitting element of the invention. The ceramic substrate 100c for mounting a light emitting element shown in FIG. 3 is of the same structure as the ceramic substrate 100a for mounting a light emitting element shown FIG. 1 except that the coat layer 112c is a coated white ceramic layer. The substrate 100c has features that a degree of freedom for selection on ceramic material from which the coat layer 112c is constituted of is large and that a material high in light reflectance can be used.

The ceramic substrate 100c for mounting a light emitting element shown in FIG. 3 can be effectively fabricated by the following method. That is, the method includes: (1) a step of forming the substrate 100c in substantially the same shape as the substrate body 111 with a composition comprising a compound including a nitride ceramics; (2) a step of coating a composition containing a white ceramics on a surface of the obtained compact; and (3) a step of firing the compact on which the composition containing a white ceramics is coated to thereby obtain the ceramic substrate 110 having the coat layer 112c made from a white ceramics. Note that in step (1), the term "substantially the same shape as the substrate body 111" means the original shape of the substrate body 111, excluding shrinkage in firing, deformation accompanied with the shrinkage, small deformation caused by working such as drilling described later.

For example, a procedure of concrete operations when the method is employed and a co-firing method is adopted as a formation method for the conductive portion is as follows:

First, the process advances in a similar way to that in a case of the substrate 100a shown in FIG. 1: the following steps advances, such as green sheet forming, drilling, drilled holes being filled with a metal paste, and formation of a conductor pattern using a printing method or the like (corresponding to the light emitting element bonding electrodes and the power supply electrodes). Note that in the method, the green sheet is different from a case where the substrate 100a is manufactured, which is shown in FIG. 1, in that the green sheet is prepared in substantially the same shape as the substrate body 111.

Then, a composition containing white ceramics is coated in places where no conductor pattern is formed on a surface on the side serving as a element placement surface of the green sheet with a printing method or the like. Thereafter, the coat was degreased and fired. Note that conditions for degreasing and firing are similar to those when the substrate 100a is manufactured. In such a way, the substrate 100c can be effectively manufactured.

Note that a composition containing a white ceramics means a composition containing a white ceramics or a ceramic powder transformable to a white ceramics by firing and preferably used is a slurry (hereinafter referred to as white ceramic paste) obtained by adding and mixing 10 to 200 parts by mass of organic solvent such as alcohols or toluene, 10 to 50 parts by mass of an organic binder and 0 to 10 parts by mass of a plasticizer such as glycerine compound and an additive such as a dispersant, combined, into 100 parts by mass of a ceramic powder of at least one kind selected from the group consisting of boron nitride, aluminum oxide, (white) aluminum nitride, magnesium oxide, titanium oxide; and boron oxide (part or all of boron oxide is transformed into boron nitride while being fired in a nitrogen atmosphere.

Note that an organic binder is preferably the same as used when a green sheet which is matured into the substrate body 111 is formed because of a high bondability between the coat layer 112c and the substrate 111. The white ceramic paste, from the same reason, is preferably a paste obtained by adding 1 to 50 parts by mass of a nitride ceramic raw material powder used in a green sheet matured into the substrate body 111 into 100 parts by mass of a white ceramic powder and besides, 0 to 50 parts by mass of a sintering aid used in preparing the green sheet matured into the substrate body 111 when required is preferably added into 100 parts by mass of a white ceramic powder. Note that coating of the white ceramic paste may be achieved with one kind of a paste or may be achieved by recoating with different kinds of pastes. Known methods such as a printing method or a spray coating method can be adopted as a coating method without a specific limitation thereon.

While description has been given of the example of co-firing method as a conductive portion forming method, the conductive portion can also be formed by means of a post-firing method. When the post-firing method is adopted, the following process can be adopted in which a pattern formation for a white ceramic paste is conducted on a surface of a green sheet matured into the substrate body 111, thereafter the green sheet is degreased and fired to prepare the ceramic substrate 110 having the coat layer 112c, then drilling is conducted on the substrate 110, thereafter the drilled holes are filled with metal paste and a pattern is formed and the metal paste has only to be fired. A method may be adopted in which only via holes are subjected to the co-firing method or the post-firing method and then, the element bonding electrodes and power supply electrodes can also formed by means of a so-called thin film metallization method such as a sputtering method or a vapor deposition method in a vacuum apparatus.

The coat layer 112 (a white ceramic layer) can also be formed by means of the following method in which a composition comprising a compound including a nitride ceramics is formed into substantially the same shape as the substrate body 111, the obtained compact is fired, a nitride ceramic paste is coated on a surface of the substrate sintered body obtained by firing the obtained compact, a degreasing treatment is applied to the coat when required, and thereafter the nitride ceramic paste is fired in an atmosphere containing a reducing gas under conditions in which voids with a diameter of 0.1 μm or more remain in a sintered body obtained by sintering the nitride ceramic paste (to be more exact, the nitride ceramic particles contained in the nitride ceramic paste).

That is, in the previous method, white ceramic paste is coated on a surface of a green sheet matured into the substrate body 111 and the white ceramic paste and the green sheet are co-fired, while in the method, the nitride ceramic paste is coated on the substrate sintered body that has been already sintered and the coat is fired and baked in given conditions to form the coat layer (a white nitride ceramic layer).

Note that the term "substrate sintered body" is a sintered body, manufactured by forming a composition comprising a compound including a nitride ceramics into substantially the same shape as the substrate body 111 to have a green sheet, and by degreasing and firing the green sheet matured into the substrate body 111 under conditions similar to those when the substrate 100a.

In the method, nitride ceramic paste coated on the substrate sintered body can be a paste similar to the paste used in manufacturing a green sheet matured into the substrate body 111 (the paste is prepared by mixing an organic solvent, an organic binder and the like into nitride ceramic powder containing a sintering aid when required).

In general when a nitride ceramic paste is formed into the shape of a sheet without being coated on the substrate sintered body and firing the sheet as a so-called a green sheet, the green sheet can shrinkable three-dimensionally in the firing; therefore, nitride ceramic particles grow while capturing particles in the neighborhood thereof to form a dense sintered body in which large crystal particles are packed in close contact. Contrast thereto, in the method, since the nitride ceramic paste is fired in a state of being coated on a surface of the substrate sintered body that has been sintered, shrinkage in a horizontal direction is restricted relative to a surface of the substrate sintered body, which disables sufficient particle growth, thereby remaining voids at grain boundaries. Hence, it is thought that a sintered body obtained by means of this method is easy to cause irregular reflection, leading to high light reflectance thereof.

It is conceivable that if voids are introduced at grain boundaries on such a principle of whitening, whitening can be realized regardless of a kind of nitride ceramics contained in the paste. It is preferable, however, that nitrides of which the substrate body and the coat layer are constituted is of the same kind from the viewpoint of bondability. In a method in which a white ceramic paste and a green sheet used as a raw material of the substrate body (111) are co-fired, it is difficult to increase a bonding strength therebetween since a nitride ceramics from which the substrate body (111) is made and white ceramics is different in kind from each other. On the other hand, in the method, both can be nitride ceramics of the same composition (however, since both are different in quality from each other because of a difference in microstructure); therefore, a bonding strength of the coat layer can be increased.

Degreasing conducted when required in the method is implemented by heat treating the substrate sintered body on which a nitride ceramic paste is coated in an atmosphere of: an oxidizing gas such as oxygen or air, a reducing gas such as hydrogen, an inert gas such as argon or nitrogen, carbon dioxide or a mixed gas thereof, or a humidified gas mixed with water vapor. Conditions for a heat treatment may be properly selected so that a temperature is in the range of from 250 to 1200° C. and a holding time is in the range of from 1 to 1000 min depending on a kind and a quantity of an organic component contained in a paste.

Firing conducted subsequent to degreasing is required to be conducted under conditions in which voids with 0.1 μm remain in an obtained sintered body (coat layer). In order for voids (gas holes) to be left in a sintered body, it is required that firing is conducted in an atmosphere containing a reducing gas, and the firing temperature on this occasion is also lower than the firing temperature in firing conducted to obtain a dense sintered body. In the manufacturing method, since shrinkage in two-dimensional direction is restricted, voids can be left in firing even if the firing is conducted at such a temperature as voids (gas holes) are annihilated when a green sheet is fired at the temperature. For example, when a nitride ceramics contained in a nitride ceramic paste is aluminum nitride, a firing temperature may be usually in the range of from 1600 to 1780° C., preferably in the range of from 1650 to 1780° C. and more preferably in the range of from 1700 to 1750° C. No specific limitation is placed on a firing time, but a firing time may be usually in the range of from 1 to 20 hr and preferably in the range of from 2 to 10 hr. If a firing temperature is excessively low, aluminum nitride particles are insufficiently sintered to reduce a strength of the sintered body. On the other hand, a firing temperature is excessively high, voids at grain boundaries are annihilated, leading disability of earning high light reflectance.

The firing is necessary to be conducted in an atmosphere containing a reducing gas and preferably conducted in an inert gas atmosphere containing a carbon vapor as a reducing gas. If firing is conducted in an atmosphere containing no reducing gas, a light reflectance has a possibility of being low. A concentration of a reducing gas in the atmosphere, which depends on a kind of a sintering aid contained in an aluminum nitride paste, is preferably of a specific weak reducing atmosphere defined below if the sintering aid is a compound containing an alkaline earth metal. When a sintering aid is a rare earth element oxide such as yttrium oxide, it is preferable to use a specific weak reducing atmosphere or an atmosphere having a carbon vapor concentration lower than in the specific weak reducing atmosphere. When rare earth element oxide such as yttrium oxide is used as an sintering aid, there arises a possibility of reduced voids at grain boundaries and of reducing a light reflectance if firing is conducted in a atmosphere containing no reducing gas at all, which also depends on a firing temperature.

A specific weak reducing atmosphere is defined as "an atmosphere in a vessel which has a dismountable cover, at least the inner wall of which is made of boron nitride, which has a means for keeping a pressure inside the vessel in a state where the cover is closed substantially equal to a pressure outside the vessel, inside which a carbon plate having a surface area in the range of from 0.024 to 24 $mm^2$ per a volume of 1 $cm^3$ of the vessel is housed and an atmosphere inside which is replaced with an inert gas and/or hydrogen gas, the vessel with the cover closed and the carbon plate in the vessel being heated at a temperature in the range of from 1650° C. to 1950° C., preferably 1700° C. to 1900° C. (in a state where even if carbon is vaporized, a carbon plate itself remains) using the same atmosphere outside the vessel as that inside the vessel as the inert gas and/or hydrogen atmosphere", and the specific weak reducing atmosphere means inert gas and/or hydrogen gas containing specific scant amount of carbon vapor. Diameters of voids at grain boundaries in a sintered body may be measured on voids recognized on a SEM photograph of a section of a sintered body. Note that the term "diameter" means the maximum diameter.

A method for manufacturing a ceramic substrate for mounting a light emitting element in which a nitride ceramic paste is coated on a substrate sintered body, and this is subjected to post-firing in the specified condition which has been described above, can be preferably adopted for manufacturing the ceramic substrate 100b for mounting a light emitting element shown in FIG. 2, a ceramic substrate (not shown and referred to as a substrate 100b') for mounting a light emitting element similar to the ceramic substrate 100b for mounting a light emitting element except that no white ceramic layer 112b is formed on a surface on the other side of the substrate from the element placement surface and the ceramic substrate 100c for mounting a light emitting element shown in FIG. 3.

When, for example, the substrate 100b or substrate 100b' is manufactured, it may be required that a nitride ceramic paste is coated on both surfaces or one surface of a substrate sintered body, the substrate body and the wet coats thereon are fired to form the coat layer 112b and thereafter, metallization is conducted thereon to form the electrodes 113 and 113'.

When the substrate 100c is manufactured, it may be required that a substrate sintered body having the via holes 114 and 114', the power supply electrodes 115 and 115' made from a high melting point metal such as W and the element connecting electrodes 113 and 113' made from a high melting point metal such as W is manufactured, subsequently a nitride ceramic paste is coated on an exposed ceramic portion of the element placement surface, the wet coat is fired to form the coat layer 112c and a noble metal layer is formed on surfaces of the electrode when required. Note that, in this case, one pair or both pairs of the power supply electrodes 115 and 115', and the element connecting electrodes 113 and 113' made from a high melting point metal such as W are not formed in advance but may be formed in a way such that a high melting point metal paste is coated when a nitride ceramic paste is coated and both pastes are simultaneously fired.

Further, the present invention will be explained below showing examples, to which it should be understood the invention is not limited. Note that the invention relates to a ceramic substrate for mounting a light emitting element having a conductive portion such as light emitting element connecting electrodes, while since an effect thereof can be confirmed from physical properties of a ceramic substrate, in examples and comparative examples shown below, on some of which a conductive portion is not formed are manufactured and physical properties thereof are compared.

EXAMPLE 1

(An Example Having Used an Aluminum Nitride Substrate on a Surface of which a Coat Layer Constituted of Oxide Imparting a Surface a High Light Reflectance was Formed by Being Subjected to Sufficient Oxidation Treatment)

Mixed in a ball mill were 100 parts by mass of aluminum nitride powder, 5.0 parts by mass of yttrium oxide, 1.0 part by mass of tetraglycerine monoolate, as a surfactant; 40 parts by mass of toluene as a solvent, 13 parts by mass of poly n-butyl methacrylate as a binder, 4.2 parts by mass of dibutyl phthalate as a plasticizer, 10 parts by mass of toluene, 5 parts by mass of butyl acetate to obtain a white slurry. Then, the obtained slurry was subjected to forming into the shape of a sheet by means of a doctor blade to prepare an insulating substrate green sheet with a thickness of 0.6 mm. The obtained green sheet was heated for degreasing at 850° C. for 2 hr in a flow of hydrogen gas containing water at 10 litters/min. Note that a temperature rise rate in degreasing was set at 2.5° C./min. After the degreasing, the degreased green sheet was put into a vessel made from aluminum nitride and heated at 1800° C. for 5 hr in a nitrogen atmosphere to obtain a sintered body. The sintered body was of a tone of light transmissive gray color.

The obtained sintered body was heat treated in the atmosphere at 1200° C. for 5 hr to thereby oxidize a surface of the sintered body. A coat layer constituted of alumina ($Al_2O_3$), which was an oxide coat, was formed to a film thickness of 20 μm, a tone of which was of a white color. The obtained sintered body was measured on a reflectance for light having a wavelength of from 300 to 800 nm by means of an integrating sphere method in a spectrophotometer U-3210 manufactured by Hitachi, Ltd. Further, after the coat layer is polished, a density was measured by means of Archimedes' method and a thermal conductivity was obtained with a thermal constant measuring instrument TC-7000 manufactured by Shinku Riko Inc. Results of the measurement are shown in Table 1. Note that an optical reflectance was again measured in a similar way after the coat layer was ultrasonic cleaned with pure water and results of the measurement were unchanged from those prior to the cleaning.

COMPARATIVE EXAMPLE 1

(An Example Using an Aluminum Nitride Substrate on which a Coat Layer Without a Desired Light Reflectance Due to Insufficient Oxidation Treatment is Formed)

A sintered body obtained in a similar way to that in Example 1 was subjected to an oxidation treatment in an oxygen atmosphere in a similar way to that in Example 1. Not that the oxidation treatment time was for 1 hr which was shorter. The coat layer constituted of alumina ($Al_2O_3$) was formed on a surface of the sintered body to a film thickness of 2 μm and a tone of the coat layer was of a light gray color. The sintered body was evaluated on a reflectance for light having wavelength of from 300 to 800 nm of a surface of the coat layer, a density and a thermal conductivity of the coat layer in a similar way to that in Example 1. Results of the measurement are all shown in Table 1.

EXAMPLE 2

(An Example Using an Aluminum Nitride Substrate on a Surface of which a Coat Layer Constituted of a White Ceramics is Coated.)

A white ceramic paste was prepared by mixing 68 parts by mass of boron nitride powder, 9 parts by mass of boron oxide powder, 23 parts by mass of aluminum nitride powder, 26 parts by mass of ethyl cellulose and 110 parts by mass of terpineol as a solvent. Then, the obtained paste was coated on one surface of an aluminum nitride green sheet adjusted in a similar way to that in Example 1 by means of a printing method to form a paste layer with a thickness of 15 μm. Thereafter, degreasing and firing were conducted in a similar way to that in Example 1 to form the coat layer (with a thickness of 10 μm) constituted of boron nitride. Note that a tone of a surface of the coat layer was of a white color. The obtained sintered body was evaluated on a reflectance for light having wave length of from 300 to 800 nm on the surface of the coat layer, a density and a thermal conductivity in a similar way to that in Example 1. Results of the measurement are all shown in Table 1. Note that a reflectance of light (an optical reflectance) was again measured in a similar way after the coat layer was ultrasonic cleaned with pure water and results of the measurement were unchanged from those prior to the cleaning.

EXAMPLE 3

(An Example Using an Aluminum Nitride Substrate on a Surface of which a Coat Layer Constituted of a White Ceramics (Boron Nitride) is Coated)

A white ceramic paste was prepared in a similar way to that in Example 2 with the exception that a composition of a white ceramic paste that was used was such that 68 parts by mass of boron nitride powder, 23 parts by mass of aluminum nitride powder, 18 parts by mass of yttrium oxide, 28 parts by mass of ethyl cellulose and 120 parts by mass of terpineol (solvent), then the obtained paste was coated on a an aluminum nitride green sheet, and degreased and sintered in a similar way to that in Example 2. The obtained sintered body substrate had the coat layer (with a thickness of 10 μm) constituted of boron nitride and a tone of the coated layer was white. The obtained sintered body was evaluated on a reflectance for light having wavelength of from 300 to 800 nm on the surface of the coated layer, density and thermal conductivity in a similar way to that in Example 1. Results of the measurement are all shown in Table 1. Note that an optical reflectance was again measured in a similar way after the coat layer was ultrasonic cleaned with pure water and results of the measurement were unchanged from those prior to the cleaning.

COMPARATIVE EXAMPLE 2

(An Example Using an Aluminum Nitride Substrate as it is)

An aluminum nitride green sheet was prepared in a similar way to that in Example 1 and fired as it was in a similar way to that in Example 1 to obtain an aluminum nitride sintered substrate. A tone of a surface of the sintered body was of a gray color. The obtained sintered body was evaluated on a reflectance for light having a wavelength of from 300 to 800 nm, density and thermal conductivity in a similar way to that in Example 1. Results of the measurement are all shown in Table 1.

TABLE 1

|  | Density | Thermal conductivity | Reflectance(%) of light with various wavelength | | | | | |
| --- | --- | --- | --- | --- | --- | --- | --- | --- |
|  | (g/cm$^3$) | (W/m · K) | 300 nm | 400 nm | 500 nm | 600 nm | 700 nm | 800 nm |
| Example 1 | 3.33 | 182 | 90 | 84 | 77 | 72 | 67 | 64 |
| Example 2 | 3.32 | 180 | 100 | 92 | 90 | 87 | 86 | 84 |
| Example 3 | 3.32 | 175 | 88 | 81 | 78 | 77 | 75 | 75 |
| Comparative example 1 | 3.33 | 182 | 26 | 35 | 40 | 42 | 42 | 40 |
| Comparative example 2 | 3.32 | 178 | 28 | 35 | 41 | 42 | 43 | 40 |

EXAMPLE 4

(An Example in which a Nitride Ceramic Paste was Coated on a Surface of a Substrate, Baked by Firing to Form a White Nitride Ceramic Layer)

A substrate was prepared that is constituted of an aluminum nitride sintered body in a similar way to that in Example 1. Then, 100 parts by mass of aluminum nitride powder (containing 0.8 mass % of oxygen) having an average particle diameter of 1.5 µm, 5 parts by mass of yttrium oxide ($Y_2O_3$) having an average particle diameter 0.5 µm, 9 parts by mass of ethyl cellulose and 40 parts by mass of terpineol were kneaded to thereby prepare an aluminum nitride paste with an adjusted viscosity of 3500 P at 25° C. Thereafter, the aluminum nitride paste was screen printed on a surface of the aluminum nitride sintered body substrate to a thickness of 300 µm and the printed paste was dried at 80° C. for 5 min. The substrate on which the paste was coated in such a way was degreased in an oxidizing atmosphere (in air). Then, the degreased paste and a carbon plate with a surface area of 320 mm² (a standard carbon plate of a square with a side of 40 mm with a thickness thereof of 3 mm and a weight of 18 g was cut into pieces each having a size of 10 mm×10 mm×3 mm thick as samples with a size ¼ times that of the standard carbon plate) were put into a carbon made vessel with a cover, the inner wall of which is made of boron nitride, and which has an inside volume of 84 cm³, so that the degreased paste and the carbon plate were brought into no contact with each other. Note that when the inside space of the vessel is put into a pressurized state by heating, the cover was slightly moved up by the raised pressure to form a clearance between the vessel proper and the cover and a pressure in inside space of the vessel was kept almost equal to the external pressure. Thereafter, the vessel was transported into a carbon furnace to fire in a nitrogen atmosphere at 1740° C. for 4 hr to obtain a substrate having a coated layer constituted of white aluminum nitride on a surface thereof.

The obtained substrate was measured on a thermal conductivity in a similar way to that in Example 1 to obtain 181 (W/m·K). A surface of the coated layer of the substrate was measured on a reflectance for light having a wavelength of from 350 to 800 nm in a similar way to that in Example 1. Results are shown in Table 2.

In addition, a microscopic (SEM) photograph was taken on a broken-out section of the substrate. The taken SEM photograph is shown in FIG. 4. Many voids with a diameter of 0.1 µm or more, as shown in FIG. 4, exist in a white aluminum nitride sintered body layer of which the coat layer was constituted.

COMPARATIVE EXAMPLE 3

(An Example in which When a Nitride Ceramic Paste was Coated on a Surface of the Substrate and the Paste Coat was Baked by Post-firing, the Firing was Conducted in Conditions in which No Void Remains in the Sintered Body)

A substrate was obtained in a similar way to that in Example 4 except that a firing temperature of the degreased paste was set to 1800° C. The coat layer on the obtained substrate was measured on a reflection for light having a wavelength of from 350 to 800 nm in a similar way to that in Example 1. Results of the measurement are shown in Table 2. A microscopic (SEM) photograph of a broken-out section of the substrate is shown in FIG. 5. No void was, as shown in FIG. 5, recognized at grain boundaries.

TABLE 2

| | Reflectance(%) of light in various wavelength | | | | |
|---|---|---|---|---|---|
| | 300 nm | 400 nm | 500 nm | 600 nm | 700 nm |
| Example 4 | 73.2% | 79.3% | 81.6% | 84.5% | 86.0% |
| Comparative example 3 | 25.5% | 33.0% | 39.4% | 42.7% | 41.9% |

Industrial Applicability

A ceramic substrate of the invention is a ceramics made substrate for mounting a light emitting element such as LED or a laser and can be preferably employed as a submount.

DESCRIPTION OF REFERENCE NUMERALS

Figure 1:
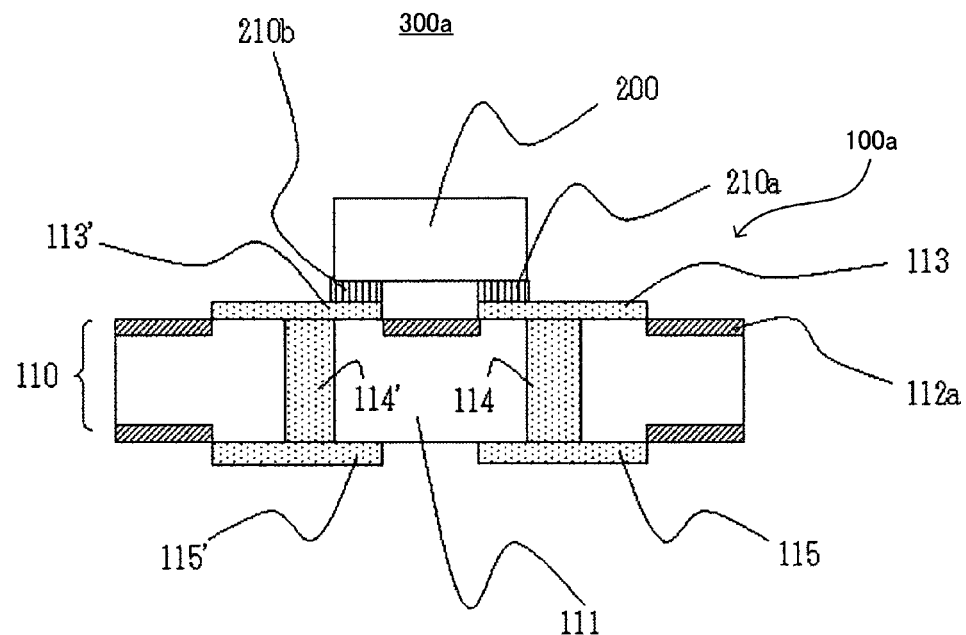
FIG. 1 is a sectional view showing a frame format of a ceramic substrate 100a of the invention.
Figure 2:
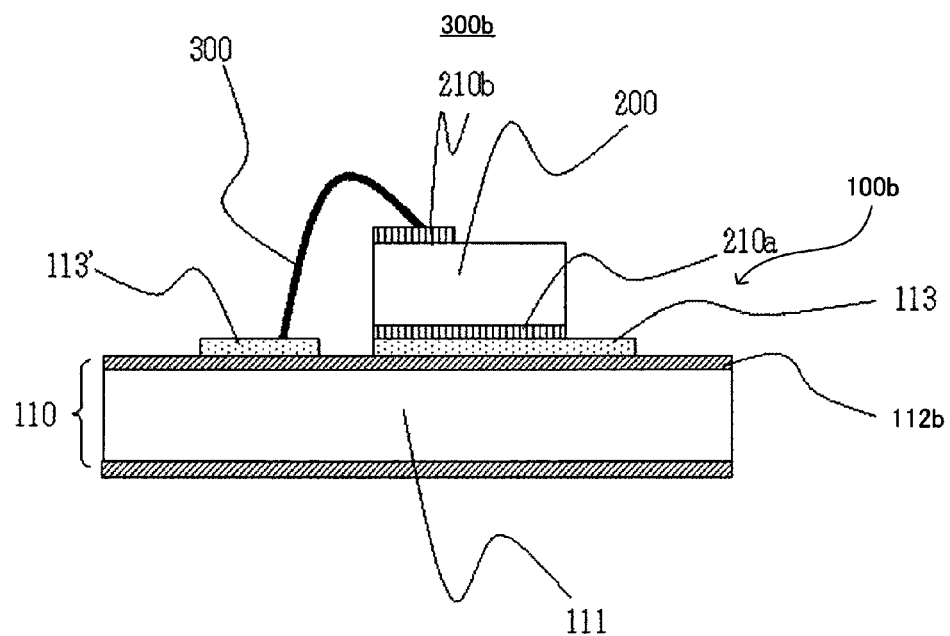
FIG. 2 is a sectional view showing a frame format of a ceramic substrate 100b of the invention.
Figure 3:
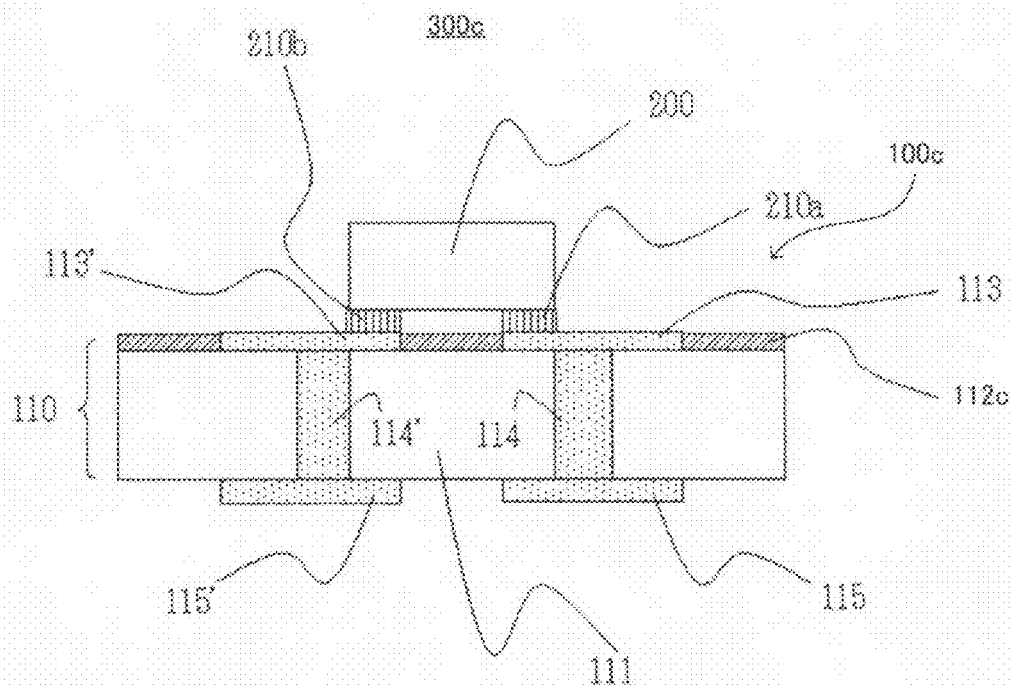
FIG. 3 is a sectional view showing a frame format of a ceramic substrate 100c of the invention.
Figure 4:
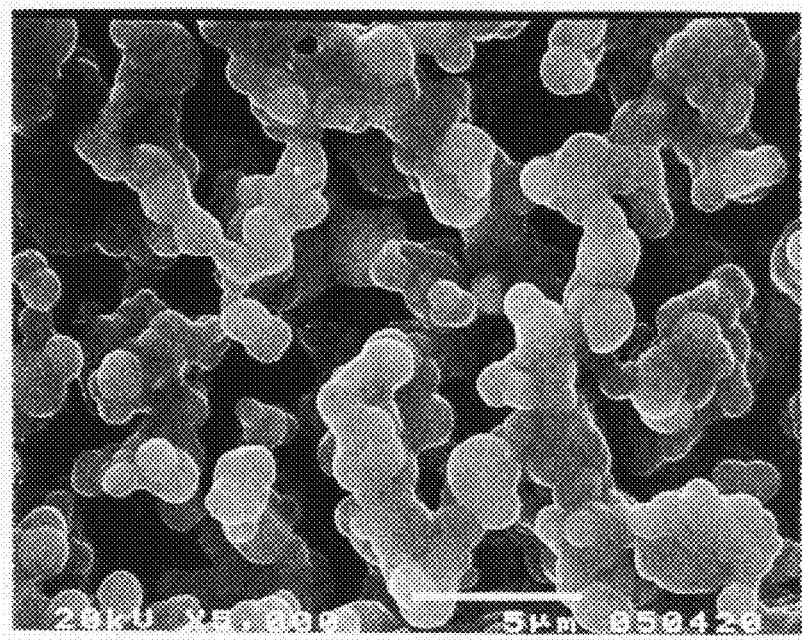
FIG. 4 is an SEM photograph taken on a broken-out section of a coat layer of the substrate obtained in Example 4.
Figure 5:
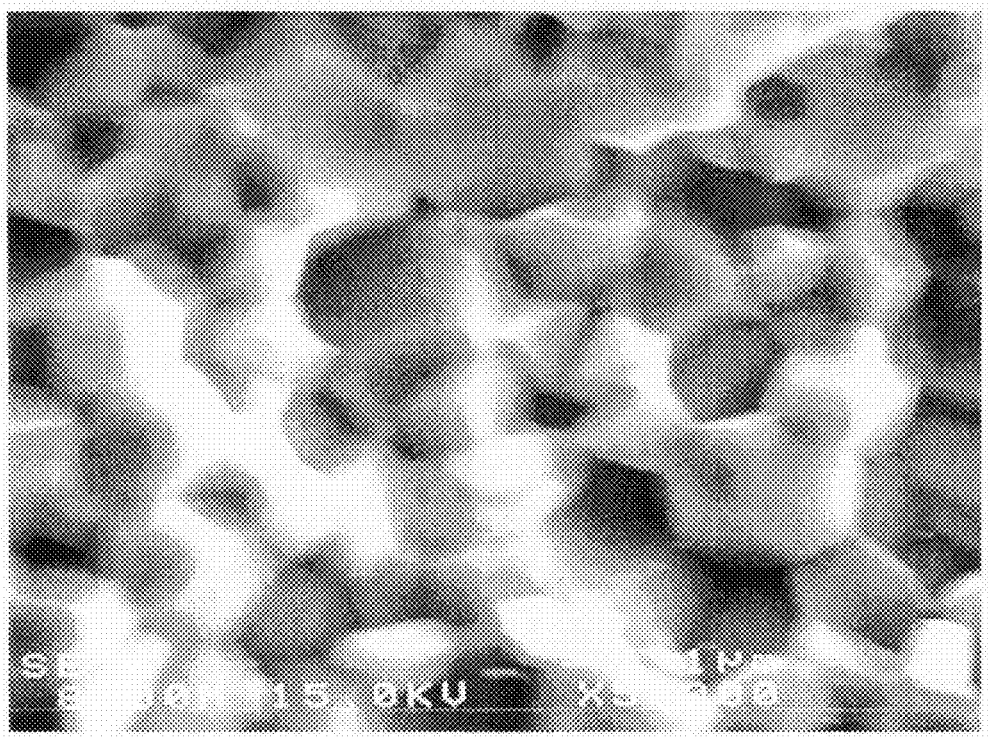
FIG. 5 is an SEM photograph taken on a broken-out section of a coat layer of the substrate obtained in Comparative Example 3.

| 100a to 100c | ceramic substrate for mounting a light emitting element |
|---|---|
| 110 | ceramic substrate |
| 111 | substrate body |
| 112a, 112b | coat layer |
| 113, 113' | light emitting element connecting electrodes |
| 114, 114' | via holes |
| 115, 115' | power supply electrodes |
| 200 | light emitting element |
| 210a, 210b | electrodes of light emitting element |
| 300 | bonding wire |

The invention claimed is:

1. A submount comprising:
   a flat-plate-shaped ceramic substrate having a placement surface, and
   an electrode,
   wherein the ceramic substrate comprises a substrate body having a gray-colored aluminum nitride sintered body with a thermal conductivity of 170 W/m·K or more, and a coat layer coating at least a part of a surface of the substrate body, the coat layer being a white ceramic different from the aluminum nitride forming the substrate body,
   wherein the lower limit of the thickness of the coat layer is 5 µm, and the upper limit of the thickness of the coat layer is 10% of the thickness of the ceramic substrate,
   wherein a surface layer portion of an exposed surface on the placement surface side of the ceramic substrate is the coat layer, and
   wherein the coat layer has an optical reflectance of 50% or more for any light having a wavelength of from 300 to 800 nm.

2. The submount according to claim 1, wherein the coat layer has an optical reflectance of 70% or more for the light with the wavelength of 400 nm.

3. A method for manufacturing the submount according to claim 1, comprising the steps of:
   forming a composition containing a compound having an aluminum nitride therein into a shape of a sheet;
   forming a conductive portion on the obtained sheet;
   firing the sheet having the conductive portion to prepare a raw substrate having a gray-colored aluminum nitride sintered body with a thermal conductivity of 170 W/m·K or more, and
   oxidizing the raw substrate in an oxygen atmosphere to obtain a ceramic substrate having a coat layer having an oxide ceramic.

4. A method for manufacturing the submount according to claim 1, comprising the steps of:
   forming a composition containing a compound having an aluminum nitride therein into substantially the same shape as a substrate body;
   coating a composition containing a white ceramic on a surface of the formed composition; and
   firing the formed composition coated with a composition containing a white ceramic to obtain a ceramic substrate comprising a substrate body having a gray-colored aluminum nitride sintered body with a thermal conductivity of 170 W/m·K or more, and a coat layer of white ceramic coated on the surface of the substrate body.

5. A method for manufacturing the submount according to claim 1, comprising the steps of:
   forming a composition containing a compound having an aluminum nitride therein into substantially the same shape as a substrate body;
   firing the formed composition to obtain a substrate body having a gray-colored aluminum nitride sintered body with a thermal conductivity of 170 W/m·K or more;
   coating an aluminum nitride paste on a surface of the sintered substrate body; and
   firing the substrate body coated with the aluminum nitride paste in an atmosphere containing a reducing gas in a firing temperature of from 1650 to 1780° C.

6. A complex light emitting element comprising the submount according to claim 1 and a light emitting element bonded onto the substrate.

* * * * *